US012663521B2

(12) United States Patent
Bohannon et al.

(10) Patent No.: US 12,663,521 B2
(45) Date of Patent: Jun. 23, 2026

(54) HYBRID LASER DRIVER AND METHODS FOR USING ELECTRO-OPTICAL PHASE-LOCKED LOOP AND ALGORITHMIC FREQUENCY LOCKING

(71) Applicant: Aeva, Inc., Mountain View, CA (US)

(72) Inventors: Eric Bohannon, Henrietta, NY (US);
Bryce Bradford, Cupertino, CA (US);
Garret Phillips, Pittsford, NY (US)

(73) Assignee: Aeva, Inc., Mountain View, CA (US)

( * ) Notice: Subject to any disclaimer, the term of this patent is extended or adjusted under 35 U.S.C. 154(b) by 783 days.

(21) Appl. No.: 18/162,426

(22) Filed: Jan. 31, 2023

(65) Prior Publication Data

US 2024/0255626 A1     Aug. 1, 2024

(51) Int. Cl.
*G01S 7/4912*     (2020.01)
*G01S 7/4911*     (2020.01)
*H03L 7/08*     (2006.01)

(52) U.S. Cl.
CPC ........... *G01S 7/4917* (2013.01); *G01S 7/4911* (2013.01); *H03L 7/08* (2013.01)

(58) Field of Classification Search
USPC ........................................................ 356/5.1
See application file for complete search history.

(56) References Cited

U.S. PATENT DOCUMENTS

| | | | | | |
|---|---|---|---|---|---|
| 10,295,673 | B1 * | 5/2019 | Tucker | .................... | G01S 17/95 |
| 10,884,130 | B1 * | 1/2021 | Viswanatha | ............ | G01S 17/89 |
| 11,231,500 | B1 * | 1/2022 | Rezk | ........................ | G01S 17/26 |
| 2005/0275827 | A1 * | 12/2005 | Mori | ...................... | G01S 7/4915 356/4.06 |
| 2020/0300980 | A1 * | 9/2020 | Behzadi | ................ | G01S 7/4812 |
| 2023/0204734 | A1 * | 6/2023 | Sobel | ...................... | G01S 7/489 356/4.01 |

OTHER PUBLICATIONS

J. Xiao et al.; "A Fast-Locking Electro-Optic PLL (EOPLL) with Lock-in Calibration (LIC) and Harmonic Suppression for LiDAR"; 2022 European Conference on Optical Communication (ECOC), Basel, Switzerland, pp. 1-4; 2022 (Year: 2022).*
A. Binaie et al.; "A Spurless and Wideband Continuous-Time Electro-Optical Phase Locked Loop (CT-EOPLL) for High Performance LiDAR"; IEEE Open Journal of the Solid-State Circuits Society, vol. 1, pp. 235-246; 2021 (Year: 2021).*

(Continued)

*Primary Examiner* — Yuqing Xiao
*Assistant Examiner* — Clint Thatcher
(74) *Attorney, Agent, or Firm* — Womble Bond Dickinson (US) LLP

(57) ABSTRACT

Aspects of the present disclosure provide light detection and ranging (LIDAR) systems and methods for using an electro-optical phase-locked loop (EOPLL) and algorithmic frequency locking hybrid driver to lock a beat frequency to the reference frequency. By using the hybrid driver, the present disclosure solves an architectural problem of LIDAR systems related to limited (e.g., narrow and applicable) reference frequency ranges, and provides a flexible and broad reference frequency range coverage. The present disclosure thus allows LIDAR systems to use the hybrid laser driver to effectively change hardware configurations to achieve desired reference frequencies.

20 Claims, 8 Drawing Sheets

(56) References Cited

OTHER PUBLICATIONS

K. Kondo and H. Hashemi, "Electro-Optical Phase-Locked Loop
Generating Linear Frequency Chirp for FMCW LiDAR," 2020
Conference on Lasers and Electro-Optics (CLEO), pp. 1-2; 2020
(Year: 2020).*
F. Ashtiani et al.; "Integrated Electro-Optical Phase-Locked Loop
for High Resolution Optical Synthesis"; Opt. Express 25, 16171-
16181; 2017 (Year: 2017).*

* cited by examiner

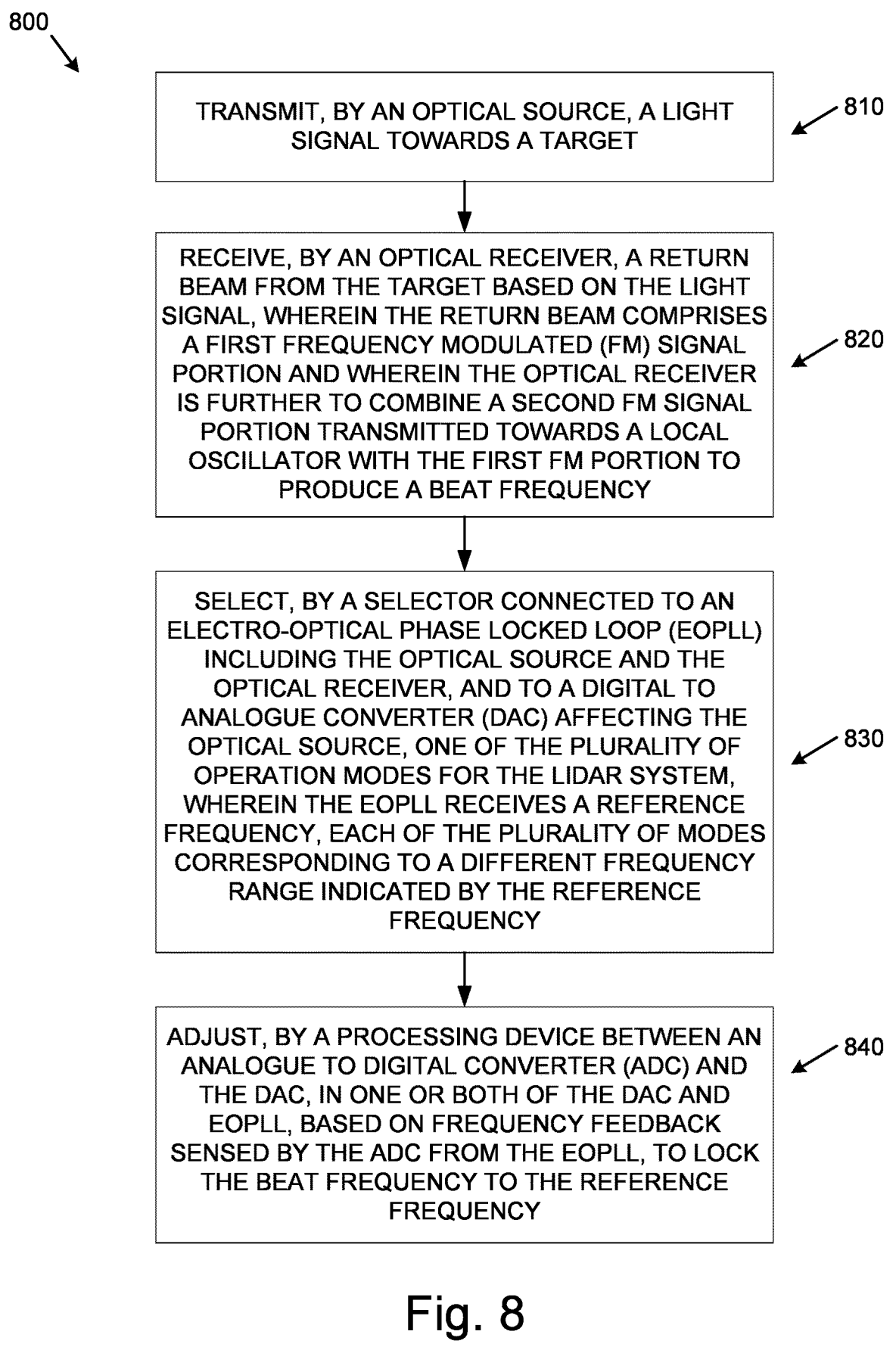

800

TRANSMIT, BY AN OPTICAL SOURCE, A LIGHT SIGNAL TOWARDS A TARGET ⟋810

RECEIVE, BY AN OPTICAL RECEIVER, A RETURN BEAM FROM THE TARGET BASED ON THE LIGHT SIGNAL, WHEREIN THE RETURN BEAM COMPRISES A FIRST FREQUENCY MODULATED (FM) SIGNAL PORTION AND WHEREIN THE OPTICAL RECEIVER IS FURTHER TO COMBINE A SECOND FM SIGNAL PORTION TRANSMITTED TOWARDS A LOCAL OSCILLATOR WITH THE FIRST FM PORTION TO PRODUCE A BEAT FREQUENCY ⟋820

SELECT, BY A SELECTOR CONNECTED TO AN ELECTRO-OPTICAL PHASE LOCKED LOOP (EOPLL) INCLUDING THE OPTICAL SOURCE AND THE OPTICAL RECEIVER, AND TO A DIGITAL TO ANALOGUE CONVERTER (DAC) AFFECTING THE OPTICAL SOURCE, ONE OF THE PLURALITY OF OPERATION MODES FOR THE LIDAR SYSTEM, WHEREIN THE EOPLL RECEIVES A REFERENCE FREQUENCY, EACH OF THE PLURALITY OF MODES CORRESPONDING TO A DIFFERENT FREQUENCY RANGE INDICATED BY THE REFERENCE FREQUENCY ⟋830

ADJUST, BY A PROCESSING DEVICE BETWEEN AN ANALOGUE TO DIGITAL CONVERTER (ADC) AND THE DAC, IN ONE OR BOTH OF THE DAC AND EOPLL, BASED ON FREQUENCY FEEDBACK SENSED BY THE ADC FROM THE EOPLL, TO LOCK THE BEAT FREQUENCY TO THE REFERENCE FREQUENCY ⟋840

Fig. 8

HYBRID LASER DRIVER AND METHODS FOR USING ELECTRO-OPTICAL PHASE-LOCKED LOOP AND ALGORITHMIC FREQUENCY LOCKING

FIELD

The present disclosure is related to light or laser image detection and ranging (LIDAR) systems.

BACKGROUND

Frequency-Modulated Continuous-Wave (FMCW) light or laser image detection and ranging (LIDAR) systems use tunable lasers for frequency-chirped illumination of targets, and coherent receivers for detection of backscattered or reflected light from the targets that are combined with a local copy of the transmitted signal (e.g., local oscillator, or LO signal). Mixing the LO signal with the return signal, delayed by the round-trip time to the target and back, generates a beat frequency at the receiver that is proportional to the distance to each target in the field of view of the LIDAR system.

To address intrinsic noise issues with semiconductor lasers, electro-optical phase-locked loops (EOPLLs) are used and often integrated in an FMCW LIDAR. EOPLLs use feedback loop to suppress noise introduced by the optical source. Phase-locked loops input oscillator has been used to control the phase of a tunable-laser or Mach-Zehnder interferometer (MZI) beat signal. An FMCW LIDAR provides precise ranging with low optical power (e.g., by use of the semiconductor lasers) using linear frequency chirps. Open-loop frequency modulation approaches often do not result in linear frequency chirps and thus require feedback. The EOPLLs therefore, helps producing the linear frequency chirps and suppresses the optical source noises. However, the performance of EOPLLs at low target beat frequencies is often not as good as the performance of EOPLLs at high beat frequencies, limiting applications at low reference frequencies in laser drivers.

SUMMARY

The present disclosure describes various examples of a hybrid laser driver and methods for using electro-optical phase-locked loop and algorithmic frequency locking. The disclosed hybrid laser driver may span a wide range of reference frequencies, including low reference frequency ranges that are not well supported by electro-optical phase locked loops (EOPLLs). For example, the present disclosure provides a hybrid laser driver that takes advantage of both EOPLL and algorithmic frequency locking (e.g., using analog to digital conversions and signal processing). The hybrid laser driver may use either or both of the EOPLL and algorithmic frequency locking configurations to accurately lock on reference frequencies.

In one example, a light detection and ranging (LIDAR) system of the present disclosure includes an optical source to transmit a light signal towards a target. The LIDAR system includes an optical receiver to receive a return beam from the target responsive to transmitting the light signal towards the target. The return beam includes a first frequency modulated (FM) signal portion. The optical receiver is further to combine a second FM signal portion transmitted towards a local oscillator with the first FM signal portion to produce a beat frequency. The LIDAR system includes a circuitry having an electro-optical phase locked loop (EOPLL). The circuitry includes the optical receiver to provide a frequency feedback based on the return beam, the optical source, and a phase frequency detector/charge pump (PFD/CP) receiving a reference frequency. The circuitry includes an analogue to digital converter (ADC) to sense the frequency feedback via a Mach-Zehnder interferometer (MZI) and the optical receiver. The circuitry includes a digital to analogue converter (DAC) to affect the optical source and a processing device in between the ADC and the DAC, the processing device configured to adjust one or both of the PFD/CP and the DAC. The circuitry includes a selector operable to select one of multiple modes for the LIDAR system. Each of the multiple modes corresponds to a different frequency range indicated by the reference frequency. The LIDAR system includes a memory to store instructions that, when executed by the circuitry, cause the LIDAR system to lock the beat frequency to the reference frequency.

In some embodiments, the optical source comprises a laser diode.

In some embodiments, the optical receiver comprises a photodiode/transimpedance amplifier (PD/TIA).

In some embodiments, the EOPLL further comprises an integrator, the integrator in connection with two or more of the PFD/CP, the DAC, and the selector. In some cases, the DAC is configured to affect the optical source directly or indirectly via the integrator based on the one of the multiple modes selected by the selector. The multiple modes may include two or more of the following.

The multiple modes include a first mode corresponding to a first frequency range of the reference frequency. The LIDAR system makes adjustments at the processing device based on measurements by the ADC to lock the frequency feedback to the reference frequency, the adjustments update the DAC, and consequently updates the light signal of the optical source. The multiple modes include a second mode corresponding to a second frequency range of the reference frequency. The LIDAR system locks the frequency feedback to the reference frequency via the EOPLL. The multiple modes include a third mode corresponding to a third frequency range of the reference frequency. The LIDAR system integrates an output from the DAC at the integrator that receives a filtered output from the PFD/CP to lock the frequency feedback to the reference frequency.

In some cases, the circuitry further includes a loop filter disposed between the PFD/CP and the integrator to filter signals from the PFD/CP to the integrator. In some cases, the second frequency range is higher than the first frequency range.

In one example, a method of selecting one of a plurality of operation modes of a light detection and ranging (LIDAR) system includes transmitting, by an optical source, a light signal towards a target. The method includes receiving, by an optical receiver responsive to transmitting the light signal towards the target, a return beam from the target. The return beam includes a first frequency modulated (FM) signal portion and wherein the optical receiver is further to combine a second FM signal portion transmitted towards a local oscillator with the first FM signal portion to produce a beat frequency. The method includes selecting, by a selector coupled to an electro-optical phase-locked loop (EOPLL) comprising the optical source and the optical receiver, and to a digital to analogue converter (DAC) affecting the optical source, one of the plurality of operation modes for the LIDAR system. The EOPLL receives a reference frequency, each of the plurality of modes corresponding to a different frequency range indicated by the reference frequency. The method includes adjusting, by a processing device between an analogue to digital converter (ADC) and the DAC, in at least one of the DAC or the EOPLL, based on a frequency feedback sensed by the ADC from the EOPLL, to lock the beat frequency to the reference frequency.

In some embodiments, transmitting the light signal toward the target includes transmitting, by a laser diode, the light signal towards the target.

In some embodiments, receiving by the optical receiver includes receiving by a photodiode/transimpedance amplifier (PD/TIA).

In some embodiments, the EOPLL further comprises an integrator, the integrator in connection with two or more of the PFD/CP, the DAC, and the selector. In some cases, the DAC is configured to affect the optical source directly or indirectly via the integrator based on the one of the plurality of modes selected by the selector.

In some embodiments, the plurality of modes includes two or more of the following. The modes may include a first mode corresponding to a first frequency range of the reference frequency. The LIDAR system makes adjustments at the processing device based on measurements by the ADC to lock the frequency feedback to the reference frequency, the adjustments update the DAC and consequently updates the light signal of the optical source. The modes may include a second mode corresponding to a second frequency range of the reference frequency. The LIDAR system locks the frequency feedback to the reference frequency via the EOPLL. The modes may include a third mode corresponding to a third frequency range of the reference frequency. The LIDAR system integrates an output from the DAC at the integrator that receives a filtered output from the PFD/CP to lock the frequency feedback to the reference frequency.

In some embodiments, the method further includes filtering signals from the PFD/CP to the integrator using a loop filter disposed between the PFD/CP and the integrator to filter.

In some embodiments, the second frequency range is higher than the first frequency range.

In one example, a frequency modulated continuous wave (FMCW) light detection and ranging (LIDAR) system includes an optical source to transmit a light signal towards a target. The light signal includes an FMCW optical beam. The FMCW LIDAR system includes an optical receiver to receive a return beam from the target responsive to transmitting the light signal towards the target. The return beam includes a first frequency modulated (FM) signal portion. The optical receiver is further to combine a second FM signal portion transmitted towards a local oscillator with the first FM signal portion to produce a beat frequency. The FMCW LIDAR system includes a circuitry of an electro-optical phase locked loop (EOPLL). The circuitry includes the optical receiver to provide a frequency feedback based on the return beam; the optical source; and a phase frequency detector/charge pump (PFD/CP) receiving a reference frequency.

The FMCW LIDAR system includes an analogue to digital converter (ADC) to sense the frequency feedback via a Mach-Zehnder interferometer (MZI) and the optical receiver. The FMCW LIDAR system includes a digital to analogue converter (DAC) to affect the optical source. The FMCW LIDAR system includes a processing device in between the ADC and the DAC. The processing device is configured to adjust one or both of the PFD/CP and the DAC. The FMCW LIDAR system includes a selector operable to select one of a plurality of modes for the LIDAR system. Each of the plurality of modes corresponding to a different frequency range indicated by the reference frequency. The FMCW LIDAR system further includes a memory to store instructions that, when executed by the circuitry, cause the LIDAR system to lock the beat frequency to the reference frequency.

In some embodiments, the optical source of the FMCW LIDAR system includes a laser diode.

In some embodiments, the optical receiver includes a photodiode/transimpedance amplifier (PD/TIA).

In some embodiments, the EOPLL further comprises an integrator, the integrator in connection with two or more of the PFD/CP, the DAC, and the selector.

Various examples of the present disclosure are described in detail below.

BRIEF DESCRIPTION OF THE DRAWINGS

For a more complete understanding of the various examples, reference is now made to the following detailed description taken in connection with the accompanying drawings in which like identifiers correspond to like elements.

FIG. 8 is a flowchart illustrating an example method for using both EOPLL and algorithmic frequency locking in a LIDAR system, according to embodiments of the present disclosure.

Like numerals indicate like elements.

DETAILED DESCRIPTION

Figure 1:
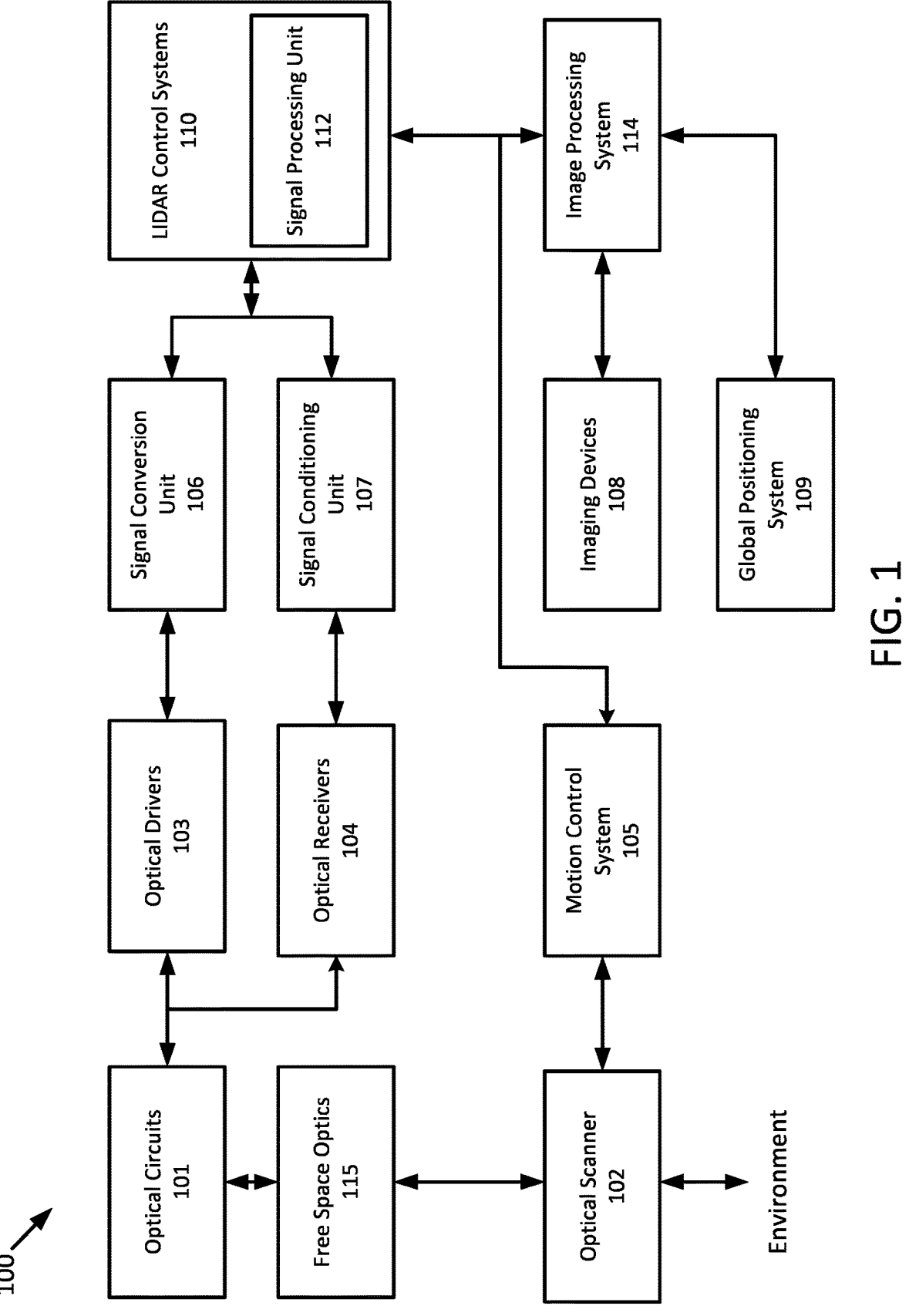
FIG. 1 illustrates an example Frequency-Modulated Continuous-Wave (FMCW) light detection and ranging (LIDAR) system according to embodiments of the present disclosure.

The present disclosure describes various examples of light or laser image detection and ranging (LIDAR) systems and methods for using an electro-optical phase-locked loop (EOPLL) and algorithmic frequency locking hybrid driver to lock a beat frequency to the reference frequency. By using the hybrid driver, the present disclosure solves an architectural problem of LIDAR systems related to limited (e.g., narrow and applicable) reference frequency ranges, and provides a flexible and broad reference frequency range coverage. The present disclosure thus allows LIDAR systems to use the hybrid laser driver to effectively change hardware configurations to achieve desired reference frequencies.

According to some embodiments, the described LIDAR system may be implemented in any sensing market, such as, but not limited to, transportation, manufacturing, metrology, medical, and security systems. According to some embodiments, the described LIDAR system can be implemented as part of a front-end of frequency modulated continuous-wave (FMCW) device that assists with spatial awareness for automated driver assist systems, or self-driving vehicles.

According to aspects of the present disclosure, techniques, and methods of using electro-optical phase-locked loop and algorithmic frequency locking. For example, a method of selecting one of a plurality of operation modes of a LIDAR system. The method includes transmitting, by an optical source, a light signal towards a target. The method includes receiving, by an optical receiver responsive to transmitting the light signal towards the target, a return beam from the target. The return beam includes a first frequency modulated (FM) signal portion. The optical receiver is further to combine a second FM signal portion transmitted towards a local oscillator with the first FM signal portion to produce a beat frequency. The method includes selecting, by a selector coupled to an EOPLL including the optical source and the optical receiver, and to a digital to analogue converter (DAC) affecting the optical source, one of the plurality of operation modes for the LIDAR system. The EOPLL receives a reference frequency, each of the plurality of modes corresponding to a different frequency range indicated by the reference frequency. The method further includes adjusting, by a processing device between an analogue to digital converter (ADC) and the DAC, in at least one of the DAC or the EOPLL, based on a frequency feedback sensed by the ADC from the EOPLL, to lock the beat frequency to the reference frequency.

Conventionally, a laser driver does not support a wide range of reference frequencies. For example, the reference frequencies can range from, 2 MHz to 32 MHz. Conventional laser drivers cover only a subset of such range. On the high frequency ranges, EOPLLs are often adopted. EOPLLs work well at higher reference frequencies because of increased loop bandwidth (e.g., having an increased ability to respond to transients from the laser diode). EOPLLs often do not work well at lower reference frequencies because of decreased loop bandwidth (e.g., having a decreased ability to quickly respond to transients from the laser diode). As such, on the low frequency ranges, EOPLLs may not be as effective as in high-frequency applications. The present disclosure provides techniques and systems for overcoming the limitations of EOPLL applications in terms of frequency range effectiveness.

An algorithmic ADC/DAC-based approach may be used to support a relatively lower frequency range that the range with EOPLLs. The algorithmic approach may work well at lower reference frequencies because of the practicality to design higher speed ADCs and DACs at lower frequencies. However, an algorithmic based approach is often independent from or separate of EOPLL configurations. According to aspects of the present disclosure, a hybrid laser driver is configurable to switch between operations that rely on EOPLL features at high frequencies and rely on algorithmic features at other frequencies. For example, the present disclosure provides a laser driver system that supports hybrid operations of an EOPLL and an algorithmic ADC/DAC-based approach.

For example, an EOPLL generally includes a feedback loop that contains at least a phase frequency detector/charge pump, loop filter, ramp control, integrator, laser diode, a Mach-Zehnder interferometer (MZI), and a photodiode/transimpedance amplifier (PD/TIA). This loop can support relatively high reference frequencies. According to aspects of the present disclosure, the EOPLL loop further includes an ADC after the PD/TIA, a DAC before the laser diode, and digital processing unit (e.g., for executing or running an algorithm-based approach) between the ADC and DAC at low reference frequencies. As such, the ADC may sense the laser diode through the MZI and PD/TIA, adjust via the algorithm executed at the digital processing unit, and feed the adjustments back to the laser diode via the DAC. This way, the hybrid laser driver provides benefits of both EOPLL and algorithm-based approach for both high and low frequency ranges.

In some cases, the hybrid laser driver may determine (e.g., based on feedback and operation records) a switch frequency value (e.g., a divider threshold, such as 6 MHz) for dividing the frequency ranges into a low and a high frequency range for the two different approaches. In some cases, such a switch frequency value is not pre-determined and the hybrid laser driver may dynamically switch between the two approaches depending on the operational feedback. As such, both of these techniques (EOPLL and algorithmic ADC/DAC-based approach) may be enabled/disabled independently of each other. Furthermore, the ADC/DAC-based approach may be used to augment the EOPLL such that the performance of the EOPLL is improved at a reduced reference frequency range (e.g., reduced from an operation range of an EOPLL without the disclosed hybrid configurations).

LIDAR systems described by the embodiments herein include coherent scan technology that includes the use of transmission lines, one or more sensors, receivers, and at least one local oscillator (i.e., a local copy of the transmission line). A scanning element (e.g., galvo mirror) is used to transmit the beam of light towards targets in the field of view of a sensor used by LIDAR systems described herein. A beam reflected from the target is collected by a lens system and combined with the local oscillator. As mirror speeds are increased, mirror movement during the round trip time to and from a target, especially for distant targets, can cause light returned from the target to be slightly off angle with respect to a scanning mirror at the time of the arrival of the returned light at a receiver. The lag angle can result in degradation of the signal-to-noise ratio at sensors of the receiver. Using the techniques described herein, embodiments of the present invention can, among other things, address the issues described above by providing an expanded field of view of the receiver on a LIDAR system. Multiple waveguides can be provided on a substrate or photonics chip to receive returned beams having different lag angles to increase the field of view of a receiver.

FIG. 1 illustrates a LIDAR system 100 according to example implementations of the present disclosure. The LIDAR system 100 includes one or more of each of a number of components, but may include fewer or additional components than shown in FIG. 1. As shown, the LIDAR system 100 includes optical circuits 101 implemented on a photonics chip. The optical circuits 101 may include a combination of active optical components and passive optical components. Active optical components may generate, amplify, and/or detect optical signals and the like. In some examples, the active optical component includes optical beams at different wavelengths, and includes one or more optical amplifiers, one or more optical detectors, or the like.

Free space optics 115 may include one or more optical waveguides to carry optical signals, and route and manipulate optical signals to appropriate input/output ports of the active optical circuit. The free space optics 115 may also include one or more optical components such as taps, wavelength division multiplexers (WDM), splitters/combiners, polarization beam splitters (PBS), collimators, couplers, non-reciprocal elements such as Faraday rotator or the like. In some examples, the free space optics 115 may include components to transform the polarization state and direct received polarized light to optical detectors using a PBS, for example. The free space optics 115 may further include a diffractive element to deflect optical beams having different frequencies at different angles along an axis (e.g., a fast-axis).

In some examples, the LIDAR system 100 includes an optical scanner 102 that includes one or more scanning mirrors that are rotatable along an axis (e.g., a slow-axis) that is orthogonal or substantially orthogonal to the fast-axis of the diffractive element to steer optical signals to scan an environment according to a scanning pattern. For instance, the scanning mirrors may be rotatable by one or more galvo mirrors. The optical scanner 102 also collects light incident upon any objects in the environment into a return optical beam that is returned to the passive optical circuit component of the optical circuits 101. For example, the return optical beam may be directed to an optical detector by a polarization beam splitter. In addition to the mirrors and galvo mirrors, the optical scanner 102 may include components such as a quarter-wave plate, lens, anti-reflective coated window or the like.

To control and support the optical circuits 101 and optical scanner 102, the LIDAR system 100 includes LIDAR control systems 110. The LIDAR control systems 110 may include a processing device such as signal processing unit 112. In some examples, signal processing unit 112 may be one or more general-purpose processing devices such as a microprocessor, central processing unit, or the like. More particularly, signal processing unit 112 may be complex instruction set computing (CISC) microprocessor, reduced instruction set computer (RISC) microprocessor, very long instruction word (VLIW) microprocessor, or processor implementing other instruction sets, or processors implementing a combination of instruction sets. Signal processing unit 112 may also be one or more special-purpose processing devices such as an application specific integrated circuit (ASIC), a field programmable gate array (FPGA), a digital signal processor (DSP), network processor, or the like.

In some examples, signal processing unit 112 is a digital signal processor (DSP). The LIDAR control systems 110 are configured to output digital control signals to control optical drivers 103. In some examples, the digital control signals may be converted to analog signals through signal conversion unit 106. For example, the signal conversion unit 106 may include a digital-to-analog converter. The optical drivers 103 may then provide drive signals to active optical components of optical circuits 101 to drive optical sources such as lasers and amplifiers. In some examples, several optical drivers 103 and signal conversion units 106 may be provided to drive multiple optical sources.

The LIDAR control systems 110 are also configured to output digital control signals for the optical scanner 102. A motion control system 105 may control the galvo mirrors of the optical scanner 102 based on control signals received from the LIDAR control systems 110. For example, a digital-to-analog converter may convert coordinate routing information from the LIDAR control systems 110 to signals interpretable by the galvo mirrors in the optical scanner 102. In some examples, a motion control system 105 may also return information to the LIDAR control systems 110 about the position or operation of components of the optical scanner 102. For example, an analog-to-digital converter may in turn convert information about the galvo mirrors' position to a signal interpretable by the LIDAR control systems 110.

The LIDAR control systems 110 are further configured to analyze incoming digital signals. In this regard, the LIDAR system 100 includes optical receivers 104 to measure one or more beams received by optical circuits 101. For example, a reference beam receiver may measure the amplitude of a reference beam from the active optical component, and an analog-to-digital converter converts signals from the reference receiver to signals interpretable by the LIDAR control systems 110. Target receivers measure the optical signal that carries information about the range and velocity of a target in the form of a beat frequency, modulated optical signal. The reflected beam may be mixed with a second signal from a local oscillator. The optical receivers 104 may include a high-speed analog-to-digital converter to convert signals from the target receiver to signals interpretable by the LIDAR control systems 110. In some examples, the signals from the optical receivers 104 may be subject to signal conditioning by signal conditioning unit 107 prior to receipt by the LIDAR control systems 110. For example, the signals from the optical receivers 104 may be provided to an operational amplifier for amplification of the received signals and the amplified signals may be provided to the LIDAR control systems 110.

In some applications, the LIDAR system 100 may additionally include one or more imaging devices 108 configured to capture images of the environment, a global positioning system 109 configured to provide a geographic location of the LIDAR system, or other sensor inputs. The LIDAR system 100 may also include an image processing system 114. The image processing system 114 can be configured to receive the images and geographic location, and send the images and location or information related thereto to the LIDAR control systems 110 or other systems connected to the LIDAR system 100.

In operation according to some examples, the LIDAR system 100 is configured to use nondegenerate optical sources to simultaneously measure range and velocity across two dimensions. This capability allows for real-time, long range measurements of range, velocity, azimuth, and elevation of the surrounding environment.

In some examples, the scanning process begins with the optical drivers 103 and LIDAR control systems 110. The LIDAR control systems 110 instruct the optical drivers 103 to independently modulate one or more optical beams, and these modulated signals propagate through the passive optical circuit to the collimator. The collimator directs the light at the optical scanning system that scans the environment over a preprogrammed pattern defined by the motion control system 105. The optical circuits 101 may also include a polarization wave plate (PWP) to transform the polarization of the light as it leaves the optical circuits 101. In some examples, the polarization wave plate may be a quarter-wave plate or a half-wave plate. A portion of the polarized light may also be reflected back to the optical circuits 101. For example, lensing or collimating systems used in LIDAR system 100 may have natural reflective properties or a reflective coating to reflect a portion of the light back to the optical circuits 101.

Optical signals reflected back from the environment pass through the optical circuits 101 to the receivers. Because the polarization of the light has been transformed, it may be reflected by a polarization beam splitter along with the portion of polarized light that was reflected back to the optical circuits 101. Accordingly, rather than returning to the same fiber or waveguide as an optical source, the reflected light is reflected to separate optical receivers. These signals interfere with one another and generate a combined signal.

Each beam signal that returns from the target produces a time-shifted waveform. The temporal phase difference between the two waveforms generates a beat frequency measured on the optical receivers (photodetectors). The combined signal can then be reflected to the optical receivers 104.

The analog signals from the optical receivers 104 are converted to digital signals using ADCs. The digital signals are then sent to the LIDAR control systems 110. A signal processing unit 112 may then receive the digital signals and interpret them. In some embodiments, the signal processing unit 112 also receives position data from the motion control system 105 and galvo mirrors (not shown) as well as image data from the image processing system 114. The signal processing unit 112 can then generate a 3D point cloud with information about range and velocity of points in the environment as the optical scanner 102 scans additional points. The signal processing unit 112 can also overlay a 3D point cloud data with the image data to determine velocity and distance of objects in the surrounding area. The LIDAR system also processes the satellite-based navigation location data to provide a precise global location.

Figure 2:
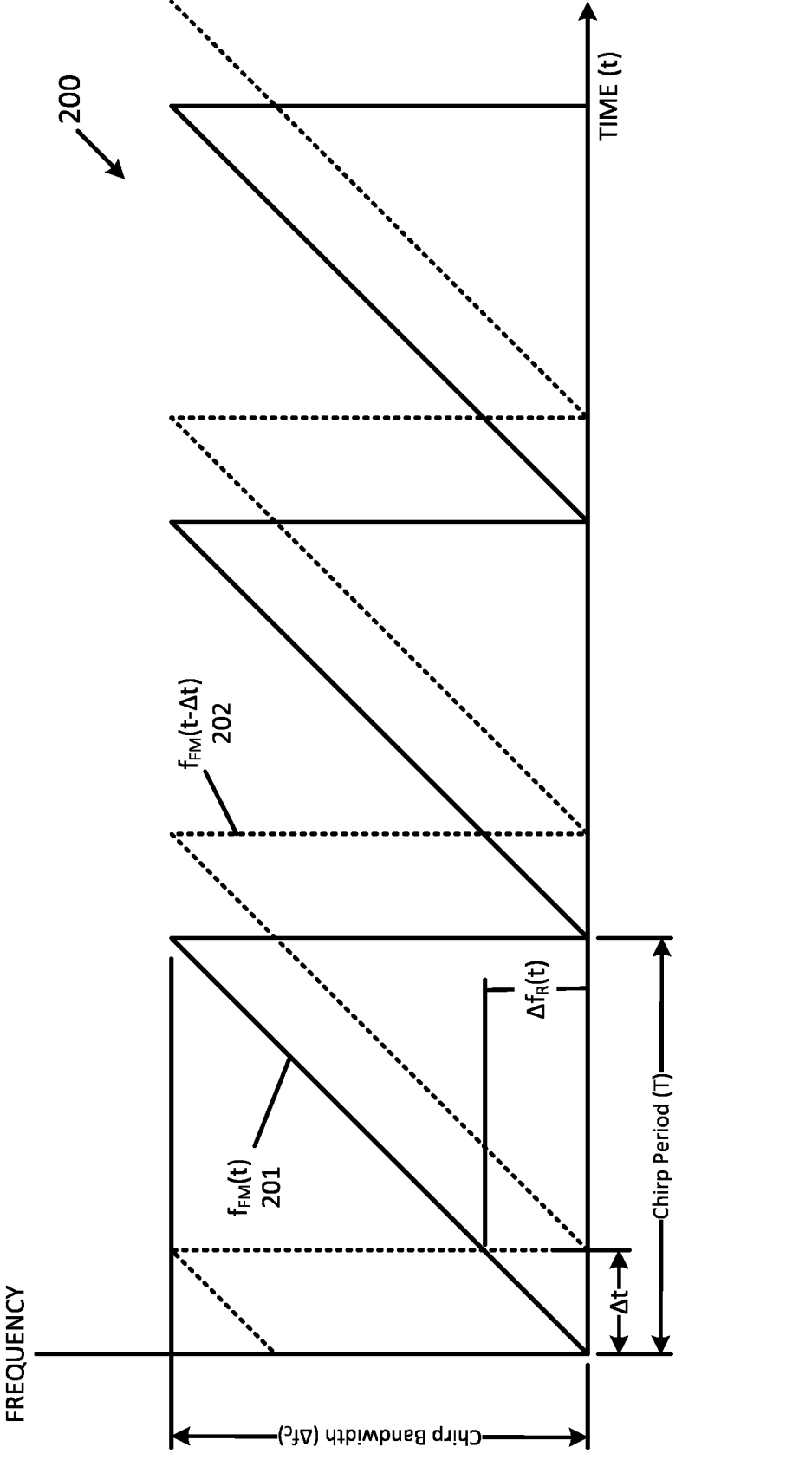
FIG. 2 is a time-frequency diagram illustrating an example of FMCW LIDAR waveforms according to embodiments of the present disclosure.

FIG. 2 is a time-frequency diagram 200 of an FMCW scanning signal 201 that can be used by a LIDAR system, such as system 100, to scan a target environment according to some embodiments. In one example, the scanning waveform 201, labeled as $f_{FM}(t)$, is a sawtooth waveform (sawtooth "chirp") with a chirp bandwidth $\Delta f_C$ and a chirp period $T_C$. The slope of the sawtooth is given as $k=(\Delta f_C/T_C)$. FIG. 2 also depicts target return signal 202 according to some embodiments. Target return signal 202, labeled as $f_{FM}(t-\Delta t)$, is a time-delayed version of the scanning signal 201, where $\Delta t$ is the round trip time to and from a target illuminated by scanning signal 201. The round trip time is given as $\Delta t=2R/v$, where R is the target range and $v$ is the velocity of the optical beam, which is the speed of light c. The target range, R, can therefore be calculated as $R=c(\Delta t/2)$. When the return signal 202 is optically mixed with the scanning signal, a range dependent difference frequency ("beat frequency") $\Delta f_R(t)$ is generated. The beat frequency $\Delta f_R(t)$ is linearly related to the time delay $\Delta t$ by the slope of the sawtooth k. That is, $\Delta f_R(t)=k\Delta t$. Since the target range R is proportional to $\Delta t$, the target range R can be calculated as $R=(c/2)(\Delta f_R(t)/k)$. That is, the range R is linearly related to the beat frequency $\Delta f_R(t)$. The beat frequency $\Delta f_R(t)$ can be generated, for example, as an analog signal in optical receivers 104 of system 100. The beat frequency can then be digitized by an analog-to-digital converter (ADC), for example, in a signal conditioning unit such as signal conditioning unit 107 in LIDAR system 100. The digitized beat frequency signal can then be digitally processed, for example, in a signal processing unit, such as signal processing unit 112 in system 100. It should be noted that the target return signal 202 will, in general, also includes a frequency offset (Doppler shift) if the target has a velocity relative to the LIDAR system 100. The Doppler shift can be determined separately, and used to correct the frequency of the return signal, so the Doppler shift is not shown in FIG. 2 for simplicity and ease of explanation. It should also be noted that the sampling frequency of the ADC will determine the highest beat frequency that can be processed by the LIDAR system without aliasing. In general, the highest frequency that can be processed is one-half of the sampling frequency (i.e., the "Nyquist limit"). In one example, and without limitation, if the sampling frequency of the ADC is 1 gigahertz, then the highest beat frequency that can be processed without aliasing ($\Delta f_{Rmax}$) is 500 megahertz. This limit in turn determines the maximum range of the LIDAR system as $R_{max}=(c/2)(\Delta f_{Rmax}/k)$ which can be adjusted by changing the chirp slope k. In one example, while the data samples from the ADC may be continuous, the subsequent digital processing described below may be partitioned into "time segments" that can be associated with some periodicity in the LIDAR system 100. In one example, and without limitation, a time segment might correspond to a predetermined number of chirp periods T, or a number of full rotations in azimuth by the optical scanner. It should be noted that while embodiments of the present disclosure may be used in conjunction with FMCW LiDAR, the disclosure is not limited to FMCW LiDAR and embodiment may be used with any other form of coherent LiDAR as well.

Figure 3:
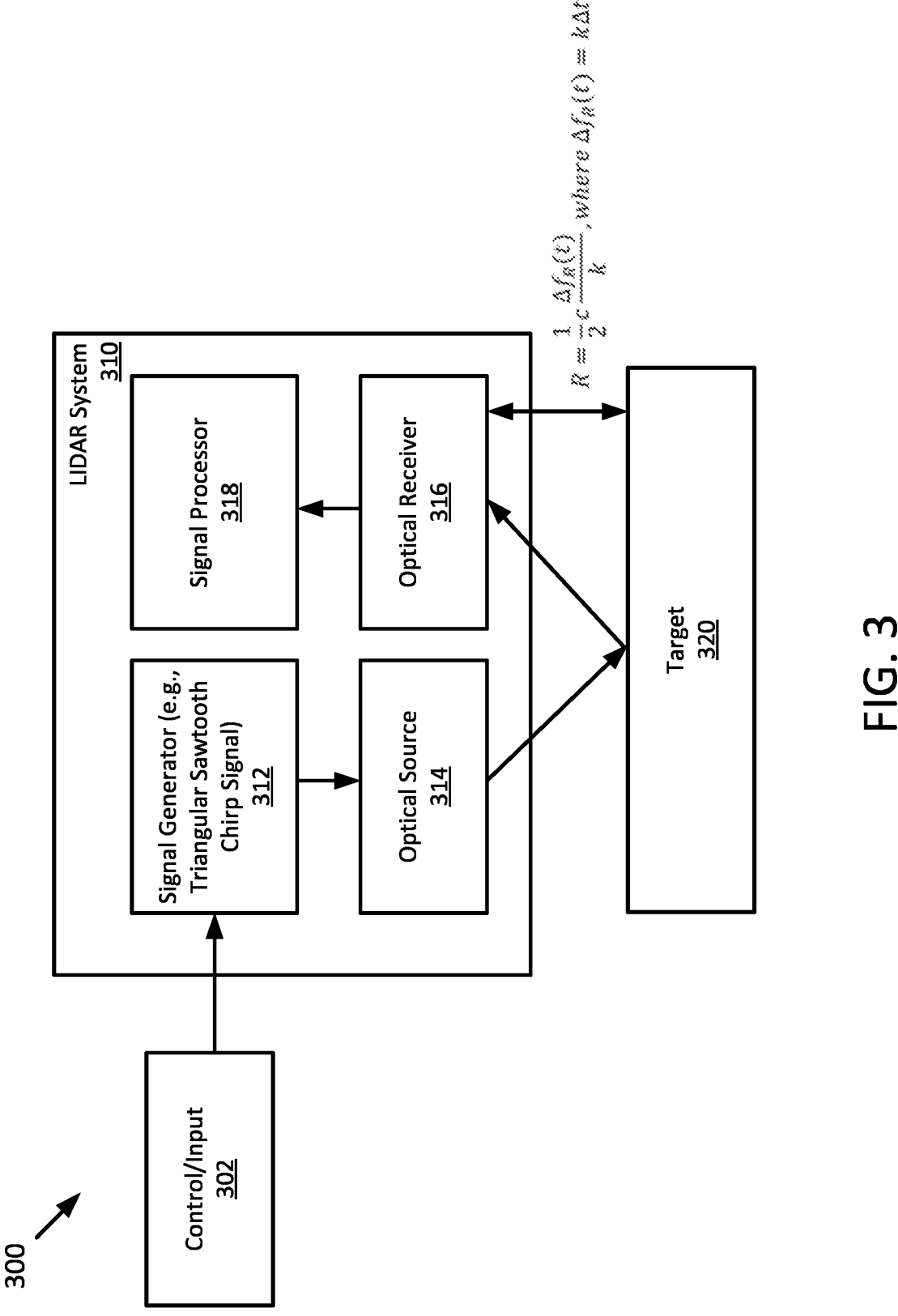
FIG. 3 illustrates an example block diagram of a LIDAR system, according to embodiments of the present disclosure.

FIG. 3 illustrates an example block diagram 300 of a LIDAR system 310 (e.g., implementing the time-frequency diagram 200 in the signal generator 312), according to embodiments of the present disclosure. The example block diagram 300 corresponds to the block diagram of FIG. 1 and includes external elements, such as controls or input module 302 and a target 320 for measurement by the LIDAR system 310. For a high level illustration as shown, the LIDAR system 310 includes a signal generator 312, an optical source 314, an optical receiver 316, and a signal processor 318.

During operation, the LIDAR system 310 receives instructions from the control/input module 302 (e.g., the LIDAR control system 110 of FIG. 1) for detecting or measuring the target 320 (e.g., the environment of FIG. 1). The control/input module 302 may provide a chirp signal, such as a triangular sawtooth chirp signal shown in FIG. 2, to the signal generator 312. The chirp signal is for use by the LIDAR 310 to modulate the phase of the optical source 314 for directly modulating the optical frequency. The optical receiver 316 measures the phase shift in the reflection from the target 320. The phase shift may be determined by comparing the reflected chirp (from the target 320) with a non-delayed version of the chirp (generated at the signal generator 312). The signal processor 318 determines, based on the phase shift, the target range $R=(c/2)(\Delta f_R(t)/k)$ as discussed in view of FIG. 2 above.

In some embodiments, the signal generator 312 may correspond to the signal conversion unit 106 and the optical drivers 103 of FIG. 1, and may be implemented by the example components in FIGS. 4-7. The optical source 314 may correspond to the optical circuits 101 and the free space optics 115 of FIG. 1, and may be implemented as the optical source 414 in FIG. 4. The optical receiver 316 may correspond to the optical receivers 104 (and the signal conditioning unit 107) of FIG. 1, and may be implemented as the optical receiver 416 in FIG. 4. The signal processor 318 may correspond to the signal processing unit 112 of FIG. 1, and may be implemented as the system data processor 450 in FIG. 4.

Figure 4:
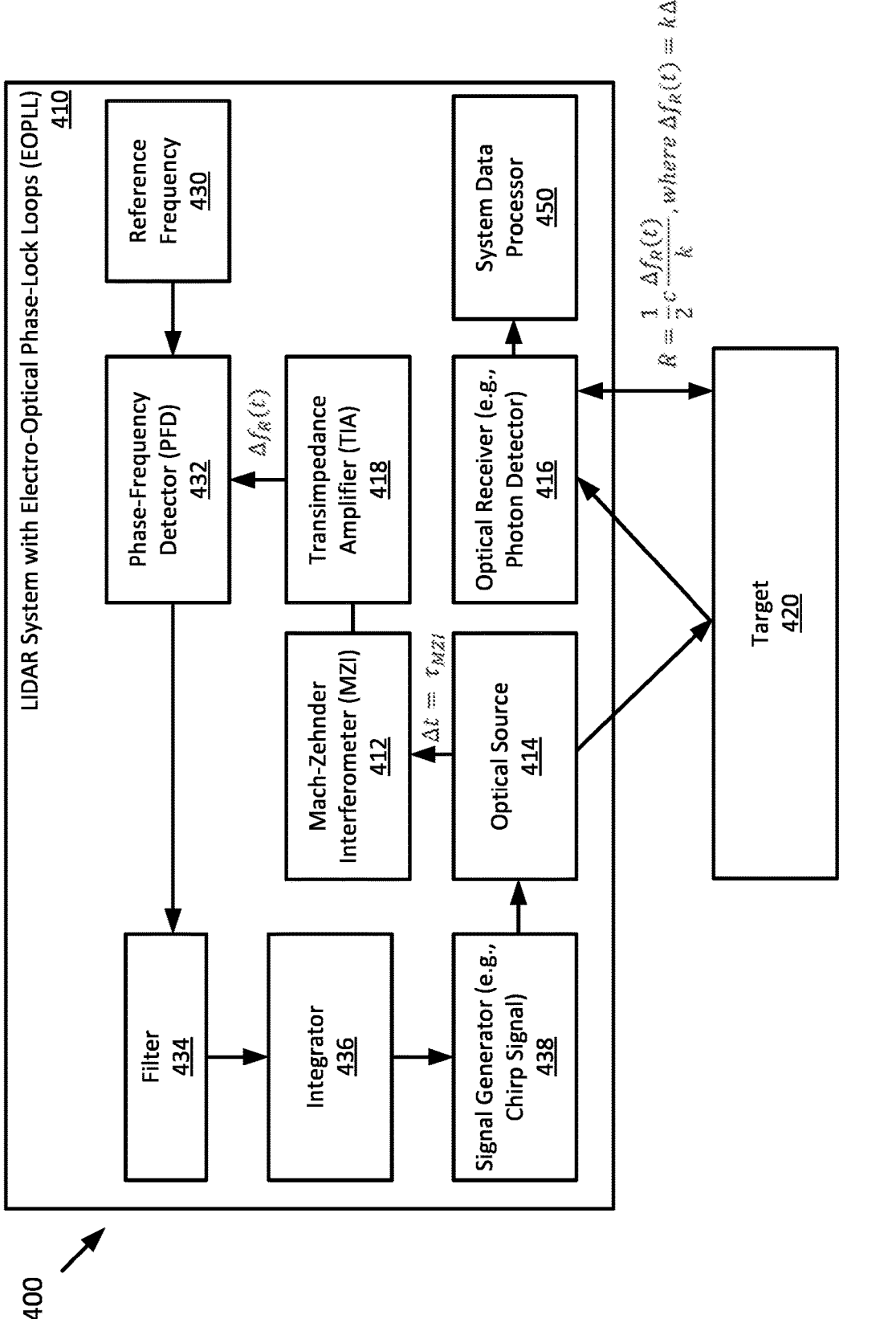
FIG. 4 illustrates an example block diagram of a LIDAR system with electro-optical phase-lock loops (EOPLL), according to embodiments of the present disclosure.

FIG. 4 illustrates an example block diagram of a LIDAR system 400 with electro-optical phase-lock loops (EOPLL) 410, according to embodiments of the present disclosure. As shown, the LIDAR system 400 further provides example components (e.g., the signal generator 438) for the signal generator 312 when an EOPLL is implemented. As shown, the EOPLL 410 includes a reference frequency 430, a phase-frequency detector (PFD) 432, a filter 434, an integrator 436, a signal generator 438, the optical source 414, a MZI 412, and a TIA 418. The loop formed by these example components provides a feedback scheme that generates a signal matching (may include a multiplier) a phase of the control signal.

The feedback loop may suppress noise added by the optical source 414. The phase of the MZI beat signal may be controlled for tuning the phase of the optical source 414 (via the signal generator 438). In some cases, the MZI 412 may be implemented as waveguides. During operation, the target 420 reflects a portion of the optical beams from the optical source 414 to the optical receiver 416 (e.g., a photon detector). The LIDAR system 400 uses the optical receiver 416 to receive a return beam from the target 420. The return beam includes a first frequency modulated (FM) signal portion (see FIG. 2). The optical receiver 416 may combine a second FM signal portion transmitted towards a local oscillator with the first FM signal portion to produce a beat frequency to be locked to the reference frequency 430. The system data processor 450 then calculates the distance from the target 420 based on the phase shift in the reflected optical beam. According to aspects of the present disclosure, the EOPLL 410 is updated and reconfigured into a hybrid driver loop as shown in FIG. 5, to include operations based on algorithmic approaches.

Figure 5:
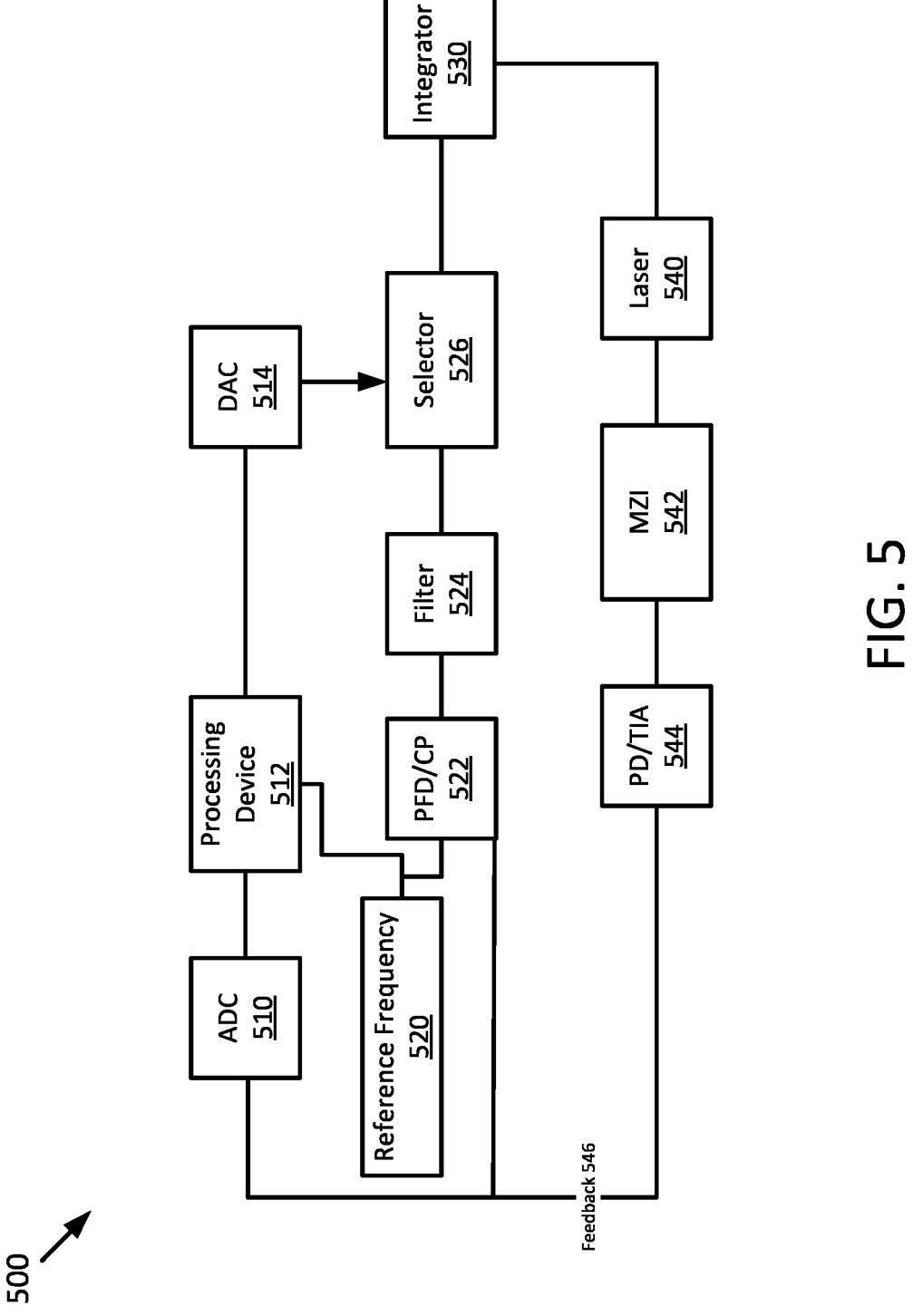
FIG. 5 illustrates an example hybrid laser driver using EOPLL and algorithmic frequency locking, according to embodiments of the present disclosure.
Figure 6:
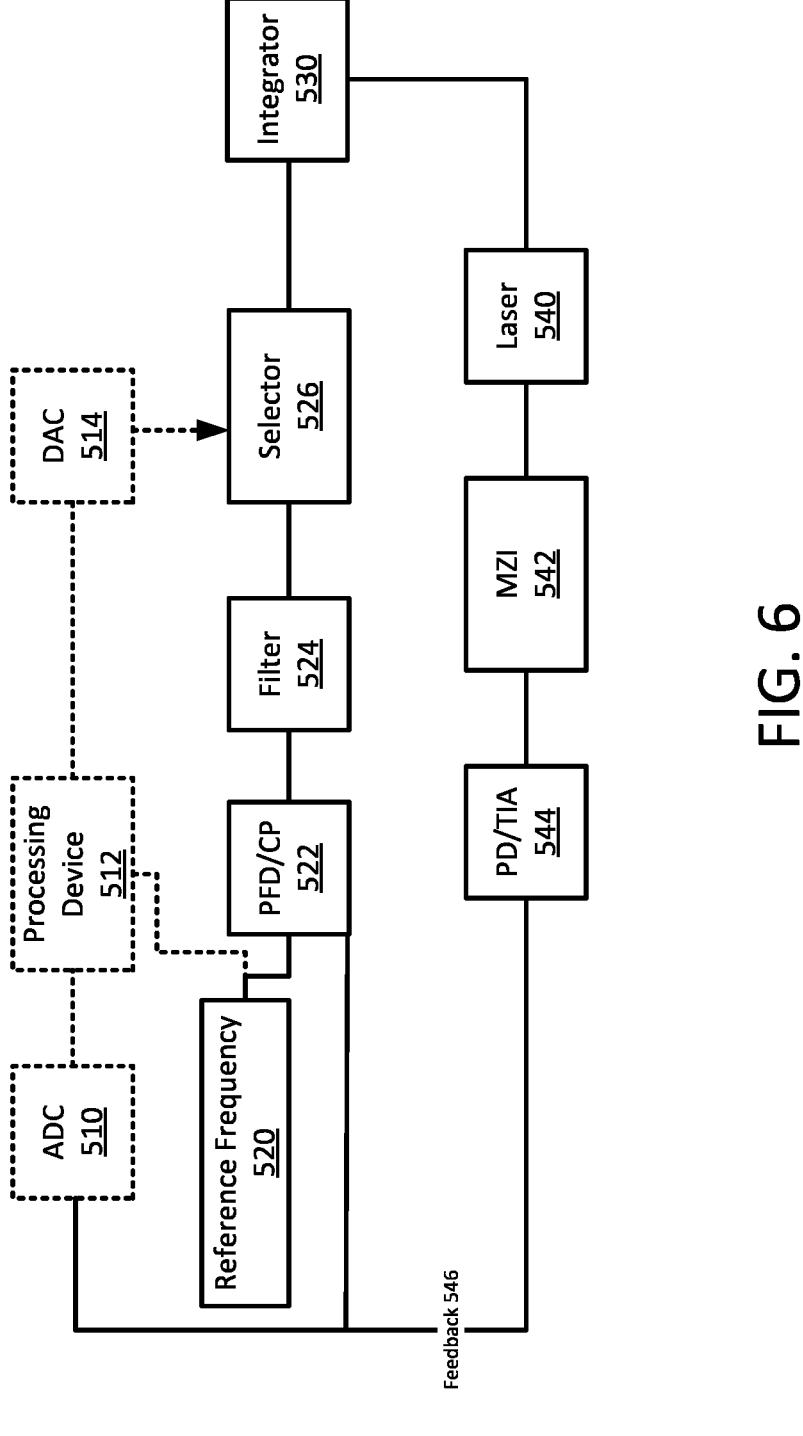
FIG. 6 illustrates the example hybrid laser driver of FIG. 5 operating in the algorithmic frequency locking mode, according to embodiments of the present disclosure.
Figure 7:
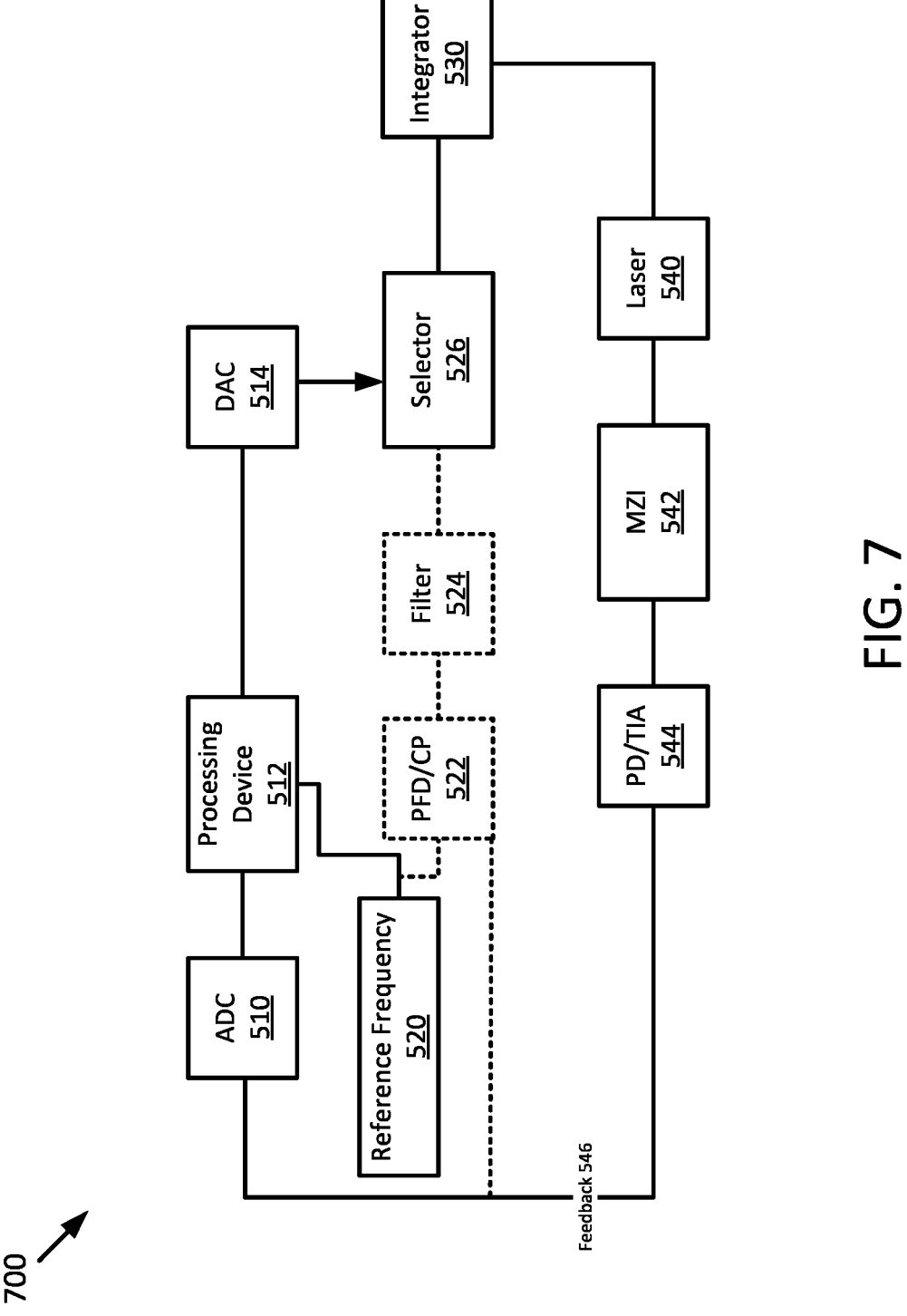
FIG. 7 illustrates the example hybrid laser driver of FIG. 5 operating in the EOPLL mode, according to embodiments of the present disclosure.

FIGS. 5-7 illustrate an example hybrid laser driver 500 using EOPLL and/or algorithmic frequency locking for a LIDAR system (such as the LIDAR system 100 of FIG. 1), according to embodiments of the present disclosure, an optical source to transmit a light signal towards a target. Comparing to FIG. 4, FIG. 5 incorporates the analog to digital converter (ADC) 510, a processing device 512 for algorithm executions, and a digital to analogue converter (DAC) 514 to provide a second feedback loop on top of the EOPLL. As such, the hybrid laser driver 500 may operate in both an EOPLL mode 600 of FIG. 6 and an algorithmic mode 700 of FIG. 7.

As shown in FIG. 5, the EOPLL feedback loop includes the integrator 530, the optical source (e.g., laser) 540, the MZI 542, the photodiode/transimpedance amplifier (PD/TIA) 544 (e.g., an optical receiver), the phase frequency detector/charge pump (PFD/CP) 522, and the filter 524). The hybrid laser driver 500 includes a selector 526 for selecting between the algorithmic loop and the EOPLL loop. The selector 526 may select between the EOPLL mode 600 and the algorithmic mode 700 for the LIDAR system. Each of the EOPLL mode 600 and the algorithmic mode 700 corresponds to a different frequency range indicated by the reference frequency 520. As shown, the selector 526 is in between the filter 524 and the integrator 530. In some cases, the selector 526 may be integrated in the filter 524 or the integrator 530 to allow the output from the DAC 514 to rejoin the circuit to affect the laser 540. The filter 524 may be a loop filter disposed between the PFD/CP 522 and the integrator 530 to filter signals from the PFD/CP 522 to the integrator 530.

During operation, as shown in FIG. 6 when the hybrid laser driver 500 is operating in the EOPLL mode 600 (e.g., not involving the ADC 510, the processing device 512, and the DAC 514 by not accepting signals from the DAC 514 at the selector 526), the EOPLL of the hybrid laser driver 500 uses the PD/TIA 544, or another instance of optical receiver (such as the optical receiver 416), to provide a frequency feedback 546 based on the return beam measured at the PD/TIA 544. The EOPLL of the hybrid laser driver 500 may use the laser 540, or another instance of optical source (such as the optical source 414), to generate an output optical beam to be reflected by a target (e.g., the target 420). In some cases, the laser 540 includes a laser diode.

The PFD/CP 522 receives a reference frequency 520 (corresponding to the reference frequency 430). The PFD/CP 522 also receives the feedback 546 from the PD/TIA 544.

The PFD/CP 522 outputs signals to be filtered by the filter 524. As shown in FIG. 7, the signals from the filter 524 may pass through the selector 526 (when in the EOPLL mode, such as when the reference frequency 520 is high, such as 8-20 MHz or above) and are provided to the integrator 530, which then drives the laser 540 to generate optical beams for LIDAR detection.

The integrator 530 is in connection with two or more of the PFD/CP 522, the DAC 514 (via the selector 526), and the selector 526. As mentioned above, the configuration of the selector 526 may change as long as the PFD/CP 522 is bypassed in the algorithmic mode 700 and the output from the DAC 514 affects the laser 540. That is, the DAC 514 is configured to affect the optical source directly or indirectly via the integrator based on the one of the plurality of modes selected by the selector.

When the hybrid laser driver 500 is operating in the algorithmic mode 700, the ADC 510 receives, senses, or measures the feedback 546, which is provided via the MZI 542 and the PD/TIA 544. For example, the feedback 546 may be in a form of varying voltage over time, and converts to digital signals at the ADC 510. The digital signals are processed at the processing device 512 (e.g., coupled with a memory locally or with the LIDAR system of the hybrid laser driver 500) and send to the DAC 514. The processing device 512 may be coupled with non-transient memory and programmed to perform configuration-specific signal processing to adjust one or both of the PFD/CP 522 and the DAC 514. In some cases, the memory stores instructions that, when executed by the circuitry, cause the system to lock the beat frequency of the LIDAR system to the reference frequency 520. The DAC 514 converts the process the digital signals into analogue voltage as input to the integrator 530. The DAC 514 thus affects the laser 540 (or another optical source) of the LIDAR system.

According to aspects of this disclosure, the selector 526 enables the hybrid laser driver 500 to operate in multiple modes. First, the selector 526 may select the algorithmic mode 700 based on a first (e.g., relatively low) frequency range of the reference frequency. The LIDAR system makes adjustments at the processing device 512 based on measurements by the ADC 510 to lock the frequency feedback 546 to the reference frequency 520. The adjustments may update the DAC 514 and consequently updates the light signal of the laser 540. Second, the selector 526 may select the EOPLL mode 600 based on a second (e.g., higher than the first frequency range) frequency range of the reference frequency. The LIDAR system locks the frequency feedback 546 to the reference frequency 520 via the EOPLL loop formed by the PFD/CP 522, the filter 524, the integrator 530, the laser 540, the MZI 542, and the PD/TIA 544. In addition, the selector 526 may operate in a hybrid mode based on a third frequency range (e.g., a transition frequency range overlapping the first and the second frequency ranges). As shown in FIG. 5, the hybrid laser driver 500 may integrate the output from the DAC 514 at the integrator 530 that receives a filtered output from the PFD/CP 522 (via the filter 524) to lock the frequency feedback to the reference frequency 520.

FIG. 8 is a flowchart illustrating an example method 800 for using both EOPLL and algorithmic frequency locking in a LIDAR system, according to embodiments of the present disclosure. The method 800 may be performed by a LIDAR system or a processing device in a LIDAR system, such as the LIDAR system 100 or the LIDAR control system 110 of FIG. 1 or the LIDAR system 400 of FIG. 4.

The method 800 begins at 810, by transmit, by an optical source, a light signal towards a target. For example, the LIDAR system may include a laser diode and one or more optics to produce the light signal (e.g., a modulated optical beam).

At 820, the method 800 continues by receiving, at an optical receiver, a return beam from the target based on the light signal. The return beam may include a first frequency modulated (FM) signal portion. The optical receiver may further combine a second FM signal portion transmitted towards a local oscillator with the first FM portion to produce a beat frequency.

At 830, the method 800 selects one of multiple operation modes for the LIDAR system by a selector (such as the selector 526 of FIGS. 5-7). The selector may be connected to an electro-optical phase locked loop (EOPLL) including the optical source and the optical receiver, and to a digital to analogue converter (DAC) affecting the optical source. The EOPLL may receive a reference frequency. Each of the multiple modes corresponds to a different frequency range indicated by the reference frequency.

In some embodiments, selecting one of multiple operations modes for the LIDAR system includes selecting two or more of the following. A first mode may be selected corresponding to a first frequency range of the reference frequency. The system makes adjustments at the processing device based on measurements by the ADC to lock the frequency feedback to the reference frequency, the adjustments update the DAC and consequently updates the light signal of the optical source. A second mode may be selected corresponding to a second frequency range of the reference frequency. The system locks the frequency feedback to the reference frequency via the EOPLL. A third mode may be selected corresponding to a third frequency range of the reference frequency. The system integrates an output from the DAC at the integrator that receives a filtered output from the PFD/CP to lock the frequency feedback to the reference frequency.

At 840, the method 800 adjusts, by a processing device between an analogue to digital converter (ADC) and the DAC, in one or both of the DAC and EOPLL, based on frequency feedback sensed by the ADC from the EOPLL, to lock the beat frequency to the reference frequency.

In some embodiments, transmitting the light signal toward the target includes transmitting, by a laser diode, the light signal towards the target. In some embodiments, receiving by the optical receiver includes receiving by a photodiode/transimpedance amplifier (PD/TIA). The EOPLL may further include an integrator in connection with two or more of the PFD/CP, the DAC, and the selector. In some cases, the DAC is configured to affect the optical source directly or indirectly via the integrator based on the one of the plurality of modes selected by the selector. In some cases, signals from the PFD/CP to the integrator are filtered using a loop filter disposed between the PFD/CP and the integrator to filter.

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary.

Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

What is claimed is:

1. A light detection and ranging (LIDAR) system, comprising:

an optical source to transmit a light signal towards a target;

an optical receiver to receive a return beam from the target responsive to transmitting the light signal towards the target, wherein the return beam comprises a first frequency modulated (FM) signal portion, the optical receiver is further to combine a second FM signal portion transmitted towards a local oscillator with the first FM signal portion to produce a beat frequency;

a circuitry comprising:

an electro-optical phase locked loop (EOPLL) including:

the optical receiver to provide a frequency feedback based on the return beam;

the optical source; and a phase frequency detector/charge pump (PFD/CP) receiving a reference frequency;

an analogue to digital converter (ADC) to sense the frequency feedback via a Mach-Zehnder interferometer (MZI) and the optical receiver;

a digital to analogue converter (DAC) to affect the optical source;

a processing device in between the ADC and the DAC, the processing device configured to adjust one or both of the PFD/CP and the DAC; and a selector operable to select one of a plurality of modes for the LIDAR system, each of the plurality of modes corresponding to a different frequency range indicated by the reference frequency, wherein the plurality of modes comprises: a first mode excluding the EOPLL, and a second mode utilizing the EOPLL; and a memory to store instructions that, when executed by the circuitry, cause the LIDAR system to lock the beat frequency to the reference frequency.

2. The LIDAR system of claim 1, wherein the optical source comprises a laser diode.

3. The LIDAR system of claim 1, wherein the optical receiver comprises a photodiode/transimpedance amplifier (PD/TIA).

4. The LIDAR system of claim 1, wherein the EOPLL further comprises an integrator, the integrator in connection with two or more of the PFD/CP, the DAC, and the selector.

5. The LIDAR system of claim 4, wherein the DAC is configured to affect the optical source directly or indirectly via the integrator based on the one of the plurality of modes selected by the selector.

6. The LIDAR system of claim 5, wherein the plurality of modes comprises two or more of the following:

the first mode corresponding to a first frequency range of the reference frequency, wherein the LIDAR system makes adjustments at the processing device based on measurements by the ADC to lock the frequency feedback to the reference frequency, the adjustments update the DAC and consequently updates the light signal of the optical source;

the second mode corresponding to a second frequency range of the reference frequency, wherein the LIDAR system locks the frequency feedback to the reference frequency via the EOPLL; and a third mode corresponding to a third frequency range of the reference frequency, wherein the LIDAR system integrates an output from the DAC at the integrator that receives a filtered output from the PFD/CP to lock the frequency feedback to the reference frequency.

7. The LIDAR system of claim 6, wherein the circuitry further comprises a loop filter disposed between the PFD/CP and the integrator to filter signals from the PFD/CP to the integrator.

8. The LIDAR system of claim 6, wherein the second frequency range is higher than the first frequency range.

9. A method of selecting one of a plurality of operation modes of a light detection and ranging (LIDAR) system, comprising:

transmitting, by an optical source, a light signal towards a target;

receiving, by an optical receiver responsive to transmitting the light signal towards the target, a return beam from the target, wherein the return beam comprises a first frequency modulated (FM) signal portion and wherein the optical receiver is further to combine a second FM signal portion transmitted towards a local oscillator with the first FM signal portion to produce a beat frequency;

selecting, by a selector coupled to an electro-optical phase-locked loop (EOPLL) comprising the optical source and the optical receiver, and to a digital to analogue converter (DAC) affecting the optical source, one of the plurality of operation modes for the LIDAR system, wherein the EOPLL receives a reference frequency, each of the plurality of modes corresponding to a different frequency range indicated by the reference frequency; and adjusting, by a processing device between an analogue to digital converter (ADC) and the DAC, in at least one of the DAC or the EOPLL, based on a frequency feedback sensed by the ADC from the EOPLL, to lock the beat frequency to the reference frequency, wherein the plurality of modes comprises: a first mode excluding the EOPLL, and a second mode utilizing the EOPLL.

10. The method of claim 9, wherein transmitting the light signal toward the target comprises transmitting, by a laser diode, the light signal towards the target.

11. The method of claim 9, wherein receiving by the optical receiver comprises receiving by a photodiode/transimpedance amplifier (PD/TIA).

12. The method of claim 9, wherein the EOPLL further comprises an integrator, the integrator in connection with two or more of the PFD/CP, the DAC, and the selector.

13. The method of claim 12, wherein the DAC is configured to affect the optical source directly or indirectly via the integrator based on the one of the plurality of modes selected by the selector.

14. The method of claim 13, wherein the plurality of modes comprises two or more of the following:

the first mode corresponding to a first frequency range of the reference frequency, wherein the LIDAR system makes adjustments at the processing device based on measurements by the ADC to lock the frequency feedback to the reference frequency, the adjustments update the DAC and consequently updates the light signal of the optical source;

the second mode corresponding to a second frequency range of the reference frequency, wherein the LIDAR system locks the frequency feedback to the reference frequency via the EOPLL; and a third mode corresponding to a third frequency range of the reference frequency, wherein the LIDAR system integrates an output from the DAC at the integrator that receives a filtered output from the PFD/CP to lock the frequency feedback to the reference frequency.

15. The method of claim 14, further comprising:

filtering signals from the PFD/CP to the integrator using a loop filter disposed between the PFD/CP and the integrator to filter.

16. The method of claim 14, wherein the second frequency range is higher than the first frequency range.

17. A frequency modulated continuous wave (FMCW) light detection and ranging (LIDAR) system, comprising:

an optical source to transmit a light signal towards a target, the light signal comprising an FMCW optical beam;

an optical receiver to receive a return beam from the target responsive to transmitting the light signal towards the target, wherein the return beam comprises a first frequency modulated (FM) signal portion, the optical receiver is further to combine a second FM signal portion transmitted towards a local oscillator with the first FM signal portion to produce a beat frequency;

a circuitry comprising:

an electro-optical phase locked loop (EOPLL) including:

the optical receiver to provide a frequency feedback based on the return beam;

the optical source; and a phase frequency detector/charge pump (PFD/CP) receiving a reference frequency;

an analogue to digital converter (ADC) to sense the frequency feedback via a Mach-Zehnder interferometer (MZI) and the optical receiver;

a digital to analogue converter (DAC) to affect the optical source;

a processing device in between the ADC and the DAC, the processing device configured to adjust one or both of the PFD/CP and the DAC; and a selector operable to select one of a plurality of modes for the LIDAR system, each of the plurality of modes corresponding to a different frequency range indicated by the reference frequency, wherein the plurality of modes comprises: a first mode excluding the EOPLL, and a second mode utilizing the EOPLL; and a memory to store instructions that, when executed by the circuitry, cause the LIDAR system to lock the beat frequency to the reference frequency.

18. The FMCW LIDAR system of claim 17, wherein the optical source comprises a laser diode.

19. The FMCW LIDAR system of claim 17, wherein the optical receiver comprises a photodiode/transimpedance amplifier (PD/TIA).

20. The FMCW LIDAR system of claim 17, wherein the EOPLL further comprises an integrator, the integrator in connection with two or more of the PFD/CP, the DAC, and the selector.

* * * * *